(12) United States Patent
Toyoda et al.

(10) Patent No.: US 8,742,246 B2
(45) Date of Patent: Jun. 3, 2014

(54) THERMOELECTRIC CONVERSION MODULE AND METHOD OF MANUFACTURING THEREOF

(75) Inventors: Kaori Toyoda, Hyogo (JP); Takaaki Higashida, Osaka (JP); Takashi Kubo, Osaka (JP)

(73) Assignee: Panasonic Corporation, Osaka (JP)

( * ) Notice: Subject to any disclaimer, the term of this patent is extended or adjusted under 35 U.S.C. 154(b) by 142 days.

(21) Appl. No.: 13/450,822

(22) Filed: Apr. 19, 2012

(65) Prior Publication Data

US 2012/0266930 A1 Oct. 25, 2012

(30) Foreign Application Priority Data

Apr. 22, 2011 (JP) ................................. 2011-095751
Apr. 22, 2011 (JP) ................................. 2011-095752

(51) Int. Cl.
*H01L 35/32* (2006.01)
*H01L 35/34* (2006.01)

(52) U.S. Cl.
USPC .......................................... 136/208; 136/206

(58) Field of Classification Search
USPC ........................... 136/203, 205, 206, 208, 209
See application file for complete search history.

(56) References Cited

U.S. PATENT DOCUMENTS

| 4,180,414 | A | * | 12/1979 | Diamond et al. ............. 136/246 |
| 5,118,905 | A | * | 6/1992 | Harada .......................... 174/109 |
| 5,885,345 | A | | 3/1999 | Sakuragi |
| 6,097,088 | A | | 8/2000 | Sakuragi |
| 6,548,750 | B1 | | 4/2003 | Picone |
| 2002/0069907 | A1 | | 6/2002 | Yamashita |
| 2006/0118160 | A1 | * | 6/2006 | Funahashi et al. ......... 136/236.1 |
| 2007/0256722 | A1 | | 11/2007 | Kondoh |
| 2008/0163916 | A1 | | 7/2008 | Tsuneoka et al. |
| 2008/0223427 | A1 | | 9/2008 | Ohno |
| 2009/0032080 | A1 | | 2/2009 | Kawauchi et al. |
| 2010/0170551 | A1 | | 7/2010 | Hiroyama et al. |
| 2012/0021551 | A1 | | 1/2012 | Kawauchi et al. |

FOREIGN PATENT DOCUMENTS

| JP | 9-181362 | | 7/1997 |
| JP | 10-63724 | | 3/1998 |
| JP | 2001-244510 | A | 9/2001 |
| JP | 2002-537658 | | 11/2002 |
| JP | 2003-197983 | | 7/2003 |
| JP | 2005-129784 | | 5/2005 |
| JP | 2006-80232 | A | 3/2006 |
| JP | 2007-227508 | | 9/2007 |
| JP | 2008-091539 | | 4/2008 |

(Continued)

*Primary Examiner* — Susan D Leong
(74) *Attorney, Agent, or Firm* — Panasonic Patent Center

(57) ABSTRACT

The invention provides a thermoelectric conversion module, which can implement a high power generation capacity and high reliability of electric connection between thermoelectric conversion elements and meet various diameters and lengths of a tube as a heat source. The thermoelectric conversion module includes a straight-chain module unit. In the module unit, plural P-type elements and plural N-type elements, which are alternately arrayed, are electrically connected in series by a braided wire A and a braided wire B. The braided wire A connects one end surface of the P-type element and one end surface of the N-type element. The braided wire B connects the other end surface of the P-type element and the other end surface of the N-type element. The braided wire B is shorter than the braided wire A. The thermoelectric conversion module including only the module unit is spirally wound around a tube as a heat source.

7 Claims, 9 Drawing Sheets

(56) References Cited

FOREIGN PATENT DOCUMENTS

| JP | 2008-108900 | 5/2008 |
| JP | 2008-305991 | 12/2008 |
| JP | 2009-43752 | 2/2009 |
| JP | 2009-206113 | 9/2009 |
| JP | 2010-278035 | 12/2010 |
| JP | 2011-14850 | 1/2011 |

* cited by examiner

US 8,742,246 B2

THERMOELECTRIC CONVERSION MODULE AND METHOD OF MANUFACTURING THEREOF

CROSS-REFERENCE TO RELATED APPLICATIONS

The present invention contains the disclosures of the specification, the drawings, and the abstract of Japanese Patent Application No. 2011-095751 filed on Apr. 22, 2011 and Japanese Patent Application No. 2011-095752 filed on Apr. 22, 2011, the entire contents of which being incorporated herein by reference.

TECHNICAL FIELD

The present invention relates to a thermoelectric conversion module and a method of manufacturing thereof.

BACKGROUND ART

An element, in which a Peltier effect or a Seebeck effect is utilized, is used as a thermoelectric conversion element. Recently, because the thermoelectric conversion element has simple-structure and, easy-to-handle, and can maintain a stable characteristic, applications of the thermoelectric conversion element are attracting attention in a wide range of fields. Particularly, when used as an electronic cooling element, the thermoelectric conversion element can perform local cooling and accurate control around room temperature. Therefore, a wide range of studies are being performed to stabilize temperatures of an optoelectronic device, a semiconductor laser, and the like.

As illustrated in FIG. 7, in a configuration of a thermoelectric module used in the electronic cooling or thermoelectric generation, a PN element pair is formed such that P-type thermoelectric conversion element (hereinafter, also referred to as "P-type element") 101 and N-type thermoelectric conversion element (hereinafter, also referred to as "N-type element") 102 are connected with connection electrode 601 interposed therebetween, and the plural PN element pairs are arrayed in series. Depending on a direction of a current passed through the PN element pair, one end of each of P-type element 101 and N-type element 102 is heated while the other end is cooled. In FIG. 7, the reference signs 602 and 603 designate external connection terminals, the reference sign 604 designates a ceramic board, and the reference sign H designates an arrow indicating the direction of a heat flow.

A material having a large performance index $Z (=\alpha^2/\rho K)$, which is expressed by a Seebeck coefficient "$\alpha$" which is of a constant unique to a substance, a specific resistance "$\rho$" and thermal conductivity "$K$", in an operating temperature range is used for the thermoelectric conversion element. A crystalline material of a $Bi_2Te_3$ alloy is generally used as the thermoelectric conversion element (for example, see PTL 1).

Usually a fluid is used to heat and cool the PN element pair of the thermoelectric conversion module to facilitate heat transport. For example, the thermoelectric conversion module is disposed on an outer circumferential wall surface of a tube in which a fluid having a temperature different from a temperature outside of the tube flows, which allows an electric power to be generated by a temperature difference between the inside and outside of the tube.

FIG. 8 illustrates a basic structure of a conventional tubular thermoelectric conversion module. The tubular thermoelectric conversion module includes a pair of stacked elements. Each of the stacked elements includes polymer material layer (board) 501, P-type element 101, N-type element 102, and connection electrode 301 that electrically connects P-type element 101 and N-type element 102 in series. Polymer material layers 501 of two stacked elements are bonded by adhesive resin 502. The bonded stacked elements are wound into a spiral or circular shape. P-type element 101 and N-type element 102 are soldered to connection electrode 301 (for example, see PTL 2).

FIG. 9 illustrates another basic structure of the conventional tubular thermoelectric conversion module. Tubular thermoelectric conversion module 401 includes insulating board 403, which includes an inside board that can abut on an outer circumferential surface of metallic tube 402 and an outside board that is bonded to the inside board, thermoelectric conversion elements 411 to 414, 421 to 424, 431 to 434, . . . , and 4m1 to 4m4 that are disposed in through-holes of insulating board 403, surface connection electrode 404X and backside connection electrode 404Y that connect end portions of the thermoelectric conversion element, and leads 404a and 404b that are connected to thermoelectric conversion elements 411 and 414. One end of each of thermoelectric conversion elements 411 to 4m4 is exposed to a surface of the inside board while the other end is exposed to a surface of the outside board.

Each of thermoelectric conversion element 411 to 4m4 includes a P-type element and an N-type element. The P-type elements and the N-type elements are alternately arrayed in a circumferential direction and an axial direction of metallic tube 402. For example, the reference sign 411 designates the P-type element, and the reference sign 414 designates the N-type element. The reference sign 421 designates the N-type element, and the reference sign 431 designates the P-type element. The P-type and N-type elements are alternately arrayed to form a matrix pattern as a whole. The end portion of the P-type element exposed to the inside board and the end portion of the N-type element exposed to the inside board are connected by backside connection electrode 404Y. On the other hand, the N-type element and the P-type element, which are exposed to the outside board of insulating board 403, are connected by surface connection electrode 404X. Therefore, all the thermoelectric conversion elements from P-type element 411 to N-type element 414 are electrically connected in series (for example, see PTL 3).

There is also well known a thermoelectric conversion module in which the thermoelectric conversion elements or a thermoelectric conversion element groups, in each of which the thermoelectric conversion elements are electrically connected in series or parallel, are electrically connected in series by a flexible electrode member. For example, there is well known a thermoelectric conversion module in which the thermoelectric conversion elements are electrically connected in series by a stretchable, fibrous electrode member (for example, see PTL 4).

There is also known a thermoelectric conversion module in which the thermoelectric conversion elements or the thermoelectric conversion element groups, which are supported by a flexible board, are electrically connected in series by the flexible electrode member such as a metallic mesh and a plain stitch wire (for example, PTLs 5 to 8). There is well known a thermoelectric conversion module in which electrodes disposed at both ends of the thermoelectric conversion elements are coupled by the plain stitch wire or a metallic tape to electrically connect the thermoelectric conversion elements in series. There is well known a thermoelectric conversion module in which the thermoelectric conversion elements, which are bonded through a glass sheet interposed therebetween, are electrically connected in series by a wire (for example, see PTLs 9 and 10).

There is well known a thermoelectric conversion module in which plural series circuits of the thermoelectric conversion elements supported by the board are connected in parallel. For example, there is well known a thermoelectric conversion module in which the thermoelectric conversion element is disposed in a hole made in each of the stacked boards, the thermoelectric conversion elements are electrically connected in series to form the series circuit, and the plural series are electrically connected in parallel (for example, see PTLs 11 and 12). There is well known a thermoelectric conversion module in which the series circuits of the thermoelectric conversion elements formed in plural doughnut-shaped boards are electrically connected in parallel and a tube a heat source is inserted in the hole made in the board (for example, see PTLs 13 and 14).

There is well known a thermoelectric conversion module in which the thermoelectric conversion element groups accommodated in a housing or the chip-shaped thermoelectric conversion element groups are electrically connected in parallel (for example, see PTLs 15 to 18).

CITATION LIST

Patent Literature

PTL 1: Japanese Patent No. 3958857
PTL 2: International Patent Publication No. 2002-537658
PTL 3: Japanese Patent Application Laid-Open No. 2005-129784
PTL 4: Japanese Patent Application Laid-Open No. 2009-206113
PTL 5: Japanese Patent Application Laid-Open No. 9-181362
PTL 6: U.S. Pat. No. 6,097,088
PTL 7: Japanese Patent Application Laid-Open No. 2009-043752
PTL 8: U.S. Patent Application Publication No. 2008/0223427
PTL 9: Japanese Patent Application Laid-Open No. 2010-278035
PTL 10: U.S. Patent Application Publication No. 2002/0069907
PTL 11: Japanese Patent No. 3879769
PTL 12: U.S. Patent Application Publication No. 2009/0032080
PTL 13: Japanese Patent Application Laid-Open No. 2008-305991
PTL 14: U.S. Patent Application Publication No. 2010/0170551
PTL 15: Japanese Patent Application Laid-Open No. 2008-108900
PTL 16: U.S. Patent Application Publication No. 2008/0163916
PTL 17: Japanese Patent Application Laid-Open No. 2011-14850
PTL 18: U.S. Patent Application Publication No. 2007/0256722

SUMMARY OF INVENTION

Technical Problem

However, the conventional tubular thermoelectric conversion module in FIG. 8 has a problem in that, because of the existence of a polymer material layer or an adhesive resin having low thermal conductivity, a temperature difference between the end portions of each of the thermoelectric conversion elements, which is effective to power generation, is decreased to reduce a power generation capacity. Because a length of the tubular thermoelectric conversion module depends on a width of a polymer material layer (board), it is difficult to change the length of the tubular thermoelectric conversion module according to dimensions of an installation site of the tube the heat source.

The conventional tubular thermoelectric conversion module in FIG. 9 has a problem in that, because the insulating board is not flexible, there is a limitation to a diameter of the tube the heat source on which the tubular thermoelectric conversion module is mounted. The power generation cannot be performed when the thermoelectric conversion module fractures only at one point.

The thermoelectric conversion module, in which the thermoelectric conversion elements or the thermoelectric conversion element groups are electrically connected by the flexible electrode member, has a problem in that electric connection between the thermoelectric conversion elements or the thermoelectric conversion element groups is insufficiently reliable when the thermoelectric conversion module is disposed on the surface of the tube.

The invention is intended to solve the above problems and an object thereof is to provide a thermoelectric conversion module that can improve reliability of the electric connection between the thermoelectric conversion elements, meet various diameters and lengths of the tube, and enhance the power generation capacity and a method of manufacturing the thermoelectric conversion module.

Solution to Problem

In order to achieve the above object, the present invention provides a thermoelectric conversion module includes a module unit, the module unit including: plural P-type thermoelectric conversion elements (P-type elements) and plural N-type thermoelectric conversion elements (N-type elements), each of the P-type elements and each of the N-type elements being alternately arrayed and electrically connected in series; a braided wire A constructed by braiding a conductive wire, the braided wire A connecting one end surface of one of the P-type elements and one end surface of one of the N-type elements; and a braided wire B constructed by braiding a conductive wire, the braided wire B connecting the other end surface of one of the P-type elements and the other end surface of one of the N-type elements, the braided wire B being shorter than the braided wire A.

The invention also provides an electric generator includes the thermoelectric conversion module wound around a tube.

The invention also provides a method of manufacturing a thermoelectric conversion module includes: a first step of preparing a braided wire A that is constructed by braiding a conductive wire and a braided wire B constructed by braiding a conductive wire, the braided wire B being shorter than the braided wire A; and a second step of alternately connecting each of plural P-type elements and each of plural N-type elements by the braided wire A and the braided wire B to obtain a module unit in which the P-type elements and the N-type elements are electrically connected in series. In the second step of the method of manufacturing a thermoelectric conversion module, one end surface of one of the P-type element and one end surface of one of the N-type element are connected by the braided wire A while the other end surface of one of the P-type element and the other end surface of one of the N-type element are connected by the braided wire B.

Advantageous Effects of Invention

The thermoelectric conversion module of the invention is made of a material having high thermal conductivity, so that the high power generation capacity can be obtained. Because the flexible thermoelectric conversion module of the invention can be formed into a spiral or ladder shape, the thermoelectric conversion module can be applied to the tube, which has various diameters and lengths and becomes the heat source. The braided wire A that connects one end surface is longer than the braided wire B that connects the other end surface. Therefore, when the thermoelectric conversion module of the invention is disposed on the tube as the heat source, the reduction of the power generation capacity, which caused by a short-circuit between the braided wire B that connects the other end surface and the braided wire B that connects the other end surface or a short-circuit between the thermoelectric conversion elements, can be prevented. Thus, the invention implements the high reliability of the electric connection between the thermoelectric conversion elements.

DESCRIPTION OF EMBODIMENTS

A thermoelectric conversion module of the invention includes a module unit. The module unit includes plural P-type elements, plural N-type elements, and conductive braided wires A and conductive braided wires B, which connect the P-type elements and N-type elements.

The P-type conversion element and the N-type element are obtained such that a thermoelectric conversion material, in which an electromotive force is generated by a temperature difference, is molded into a desired shape while a proper dopant is added to the thermoelectric conversion material. The thermoelectric conversion material can be selected according to the temperature difference generated when used. Examples of the thermoelectric conversion element material include a bismuth-tellurium (Bi—Te) alloy for the temperature difference ranging from room temperature to 500 K, a lead-tellurium (Pb—Te) alloy for the temperature difference ranging from room temperature to 800 K, and a silicon-germanium ((Si—Ge) alloy for the temperature difference ranging from room temperature to 1000 K. Sb can be included as an example of the dopant that obtains the P-type thermoelectric conversion material. Se can be included as an example of the dopant that obtains the N-type thermoelectric conversion material. The dopants are added to the thermoelectric conversion materials with a quantity expressed by a compositional formula of the thermoelectric conversion material such as "$Bi_{0.5}Sb_{1.5}Te_3$" and "$Bi_2Te_{2.7}Se_{0.3}$". The P-type element and the N-type element can be obtained such that an ingot made of the P-type material or the N-type material is cut by a conventional method such as dicing. The P-type elements and the N-type elements are alternately disposed along a direction X (an arrow X in FIG. 2(b)).

Each of the P-type element and the N-type element includes one end surface and the other end surface along the direction X. For example, "one end surface/the other end surface along the direction X" is an end surface in a direction Y (an arrow Y in FIG. 2(b)) orthogonal to the direction X.

Figure 2A:
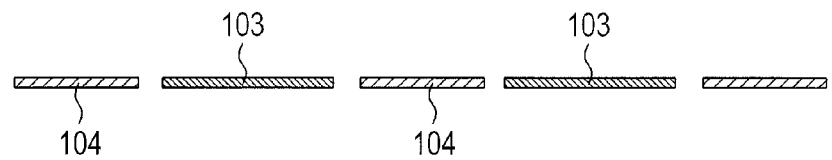
FIG. 2 is a view illustrating a method for producing the thermoelectric conversion module of Embodiment 1 of the invention.
Figure 2B:
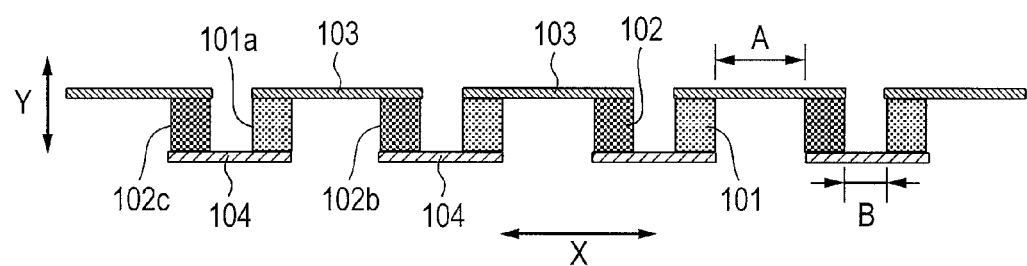

Braided wire A connects, in the direction X, one end surface of the P-type element (for example, the reference sign 101a in FIG. 2(b)) and one end surface of the N-type element (the reference sign 102b) adjacent to P-type element 101a. For example, one end surface means an upper-side end surface in FIG. 2(b). Braided wire B connects, in the direction X, the other end surface of the P-type element (the reference sign 101a) and the other end surface of the N-type element (the reference sign 102c) adjacent to P-type element 101a. For example, the other end surface means a lower-side end surface in FIG. 2(b). Braided wire A and braided wire B can be connected with the element by a conventional method for bonding the thermoelectric conversion material with the metallic electrode such as soldering and brazing.

Each of braided wire A and braided wire B is constructed by a conductive braided wire in which a conductive wire is braided. Desirably the braided wire is a single-layer braided wire from the viewpoint of enhancing the reliability of the connection between the thermoelectric conversion element and the braided wire. As used herein, "single-layer" means that overlapping of a portion in which the conductive wire is braided does not exist. Examples of the braided wire include a three-strand braided wire, a four-strand braided wire, a six-strand braided wire, a plain-stitch braided wire, and a mesh.

From the viewpoint of obtaining the soft braided wire and sufficient bonding strength between the thermoelectric conversion element and the braided wire, desirably a diameter of the conductive wire ranges from 50 μm to 400 μm, more desirably the diameter ranges from 100 μm to 400 μm, and furthermore desirably the diameter ranges from 80 μm to 300 μm.

Braided wire A is longer than braided wire B. A length of the braided wire A is defined as a length of a part of the braided wire A which connects one end edge in the direction X of the P-type element with the other end edge in the direction X of the N-type element. A length of the braided wire B is defined as a length of a part of the braided wire B which connects the other end edge in the direction X of the P-type element is connected to one end edge in the direction X of the N-type element. The length of braided wire A and the length of braided wire B can be determined according to dimensions of the thermoelectric conversion element and an outer diameter of a tube that is of a heat source on which the thermoelectric conversion module is disposed as an electric generator. Desirably braided wire A has the length in which a gap A (the reference sign A in FIG. 2(b)) between one end edge in the direction X of the P-type element and the other end edge in the direction X of the N-type element, the length in the direction X of one end surface of the P-type element, and the length in the direction X of one end surface of the N-type element are added. Desirably braided wire B has the length in which a gap B (the reference sign B in FIG. 2(b)) between the other end edge in the direction X of the P-type element and one end edge in the direction X of the N-type element, the length in the direction X of the other end surface of the P-type element, and the length in the direction X of the other end surface of the N-type element are added.

The thermoelectric conversion module of the invention may further include another configuration except the above configuration within a range where the advantageous effect of the invention is obtained. Examples of another configuration include an insulating layer that covers the surface of braided wire A, and an electric wire.

The insulating layer can be formed using a conventional material used to insulate wiring. Examples of the material for the insulating layer include a fluorine resin, an acrylic resin, and an urethane resin. Desirably, from the viewpoint of obtaining the sufficient bonding strength between the braided wire and the thermoelectric conversion element, the insulating layer is formed on the surface of braided wire A after braided wire A is connected to the thermoelectric conversion element.

The electric wire is a member that electrically connects the plural module units in parallel. The electric wire may be a conductive member, and desirably has flexibility from the viewpoint of enabling the thermoelectric conversion module to be disposed as the electric generator in various ways on the tube.

The module unit constitutes a chain-like thermoelectric conversion module in series. For example, the thermoelectric conversion module is wound into an arc or spiral shape around an outer circumferential wall of the tube, which becomes the heat source, such that braided wire B is in contact with the outer circumferential wall. An electric instrument or a storage battery is electrically connected between both the ends of the thermoelectric conversion module while a conductive member such as an external connection terminal is interposed between the electric instrument or storage battery and the ends of the thermoelectric conversion module. Therefore, the thermoelectric conversion module can act as the electric generator that generates the electromotive force by the temperature difference between the inside and outside of the tube as the heat source.

The plural module units are connected to the pair of electric wires in parallel, thereby forming a ladder-shape thermoelectric conversion module. For example, the ladder-shape thermoelectric conversion module is wound around the tube as the heat source, such that the module unit is disposed along the circumferential direction of the tube, and such that braided wire B is in contact with the outer circumferential wall of the tube. The electric instrument or the storage battery is electrically connected between the electric wires while the conductive member such as the external connection terminal is interposed between the electric instrument or storage battery and the electric wire. Therefore, the thermoelectric conversion module can act as the electric generator that generates the electromotive force by the temperature difference between the inside and outside of the tube as the heat source.

In producing the straight-chain thermoelectric conversion module, first braided wire A and braided wire B are prepared (first process). The plural P-type elements and the plural N-type elements are alternately connected by braided wire A and braided wire B to form the module unit (second process). In the second process, one end surface of the P-type element and one end surface of the N-type element are connected by braided wire A. The other end surface of the P-type element and the other end surface of the N-type element are connected by braided wire B. The process of connecting one end surface of the P-type element and one end surface of the N-type element by braided wire A and the process of connecting the other end surface of the P-type element and the other end surface of the N-type element by braided wire B may be performed in this order or the reverse order.

The ladder-shape thermoelectric conversion module can be produced such that the plural module units are prepared through the first process and the second process and electrically connected in parallel.

Embodiments of the invention will be described below with reference to the drawings.

Embodiment 1

Figure 1A:
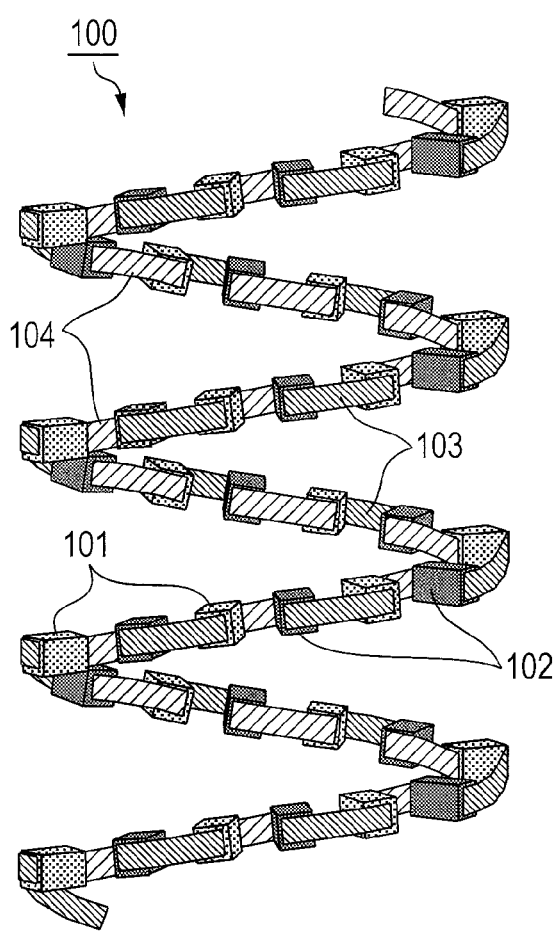
FIG. 1 is a view illustrating a schematic configuration of a thermoelectric conversion module according to Embodiment 1 of the invention.
Figure 1B:
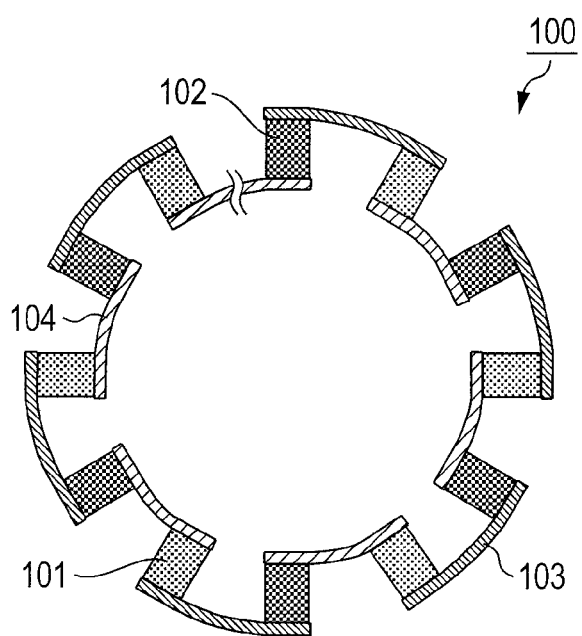

FIG. 1 is a schematic diagram of thermoelectric conversion module 100 according to Embodiment 1 of the invention. FIG. 1(a) is a perspective view of thermoelectric conversion module 100, and FIG. 1(b) is a plan view of thermoelectric conversion module 100.

1. Configuration of Thermoelectric Conversion Module

Thermoelectric conversion module 100 of Embodiment 1 basically includes P-type element 101, N-type element 102, braided wire 103, and braided wire 104. Braided wire 103 corresponds to braided wire A. Braided wire 104 corresponds to braided wire B. P-type elements 101 and N-type elements 102 are alternately disposed in a spiral circumferential direction illustrated in FIG.1. At this point, as illustrated in FIG.1, one end surface of each of P-type elements 101 and one end surface of each of N-type elements 102 are connected by braided wire 103, and the other end surface of each of P-type elements 101 and the other end surface of each of N-type element 102 are connected by braided wire 104. All the thermoelectric conversion elements including P-type elements 101 and N-type elements 102 are connected in series by a disposition relationship between the thermoelectric conversion elements and the braided wires.

In Embodiment 1, particularly all the thermoelectric conversion elements are connected (arrayed) in series. Alternatively, for example, some thermoelectric conversion elements may be connected in parallel depending on a voltage and a current necessary for thermoelectric conversion module 100.

In Embodiment 1, a Bi—Te alloy exerting excellent performance near room temperature is used as the materials for P-type element 101 and N-type element 102. However, the material for the thermoelectric conversion element is not limited to the Bi—Te alloy, but the material may be changed according to a usage environment or an intended use of thermoelectric conversion module 100.

Braided wire 103 is longer than braided wire 104. Therefore, when thermoelectric conversion module 100 is wound around the tube as the heat source (not illustrated), a short-circuit between braided wires 104 or a short-circuit between the thermoelectric conversion elements can be suppressed to prevent a decrease in power generation capacity.

Cu (copper), Al (aluminum), Ni (nickel), and alloys thereof, which have the excellent thermal conductivity, may be used as the materials for braided wire 103 and braided wire 104.

2. Configuration of Braided Wire

Figure 3A:
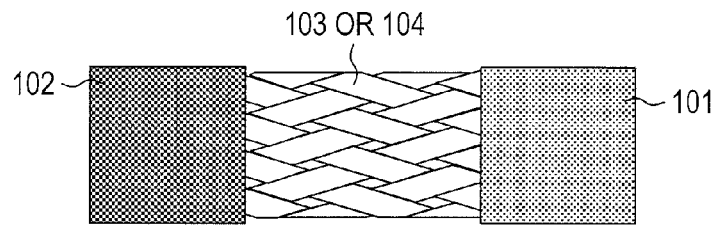
FIG. 3 is a plan view illustrating an example of a braided wire constructed by plural conductive material wires.
Figure 3B:
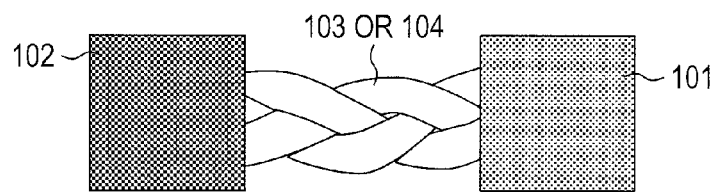
Figure 3C:
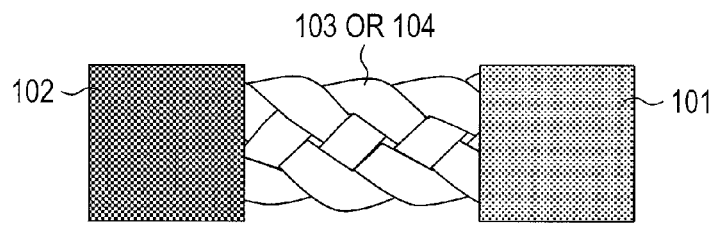
Figure 3D:
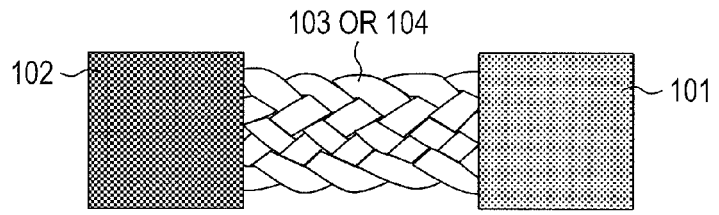

As illustrated in FIG. 3, more desirably each of braided wire 103 and braided wire 104 is a mesh (FIG. 3(a)) and the like in which plural conductive wires are braided. Therefore, a contact area between a bonding material and braided wire 103 or braided wire 104 is enlarged when P-type element 101 or N-type element 102 and braided wire 103 or braided wire 104 are bonded using the bonding material such as a solder and a brazing material.

Accordingly, even if a stress is applied to a bonded portion of P-type element 101 or N-type element 102 and braided wire 103 or braided wire 104 in spirally winding thermoelectric conversion module 100 around the tube (not illustrated) the heat source, a fracture of the bonded portion can be prevented. Additionally, long-term bonding reliability (life) is improved.

In bonding the thermoelectric conversion element and the braided wire, the bonding material runs through a gap between the conductive wires of the braided wire. Therefore, the bonded portion is prevented from swelling by the bonding material. Accordingly, the braided wire is desirably used from the viewpoint of enhancing the contact between the thermoelectric conversion element and the tube as the heat source.

In braided wire 103 and braided wire 104, desirably a section orthogonal to a lengthwise direction of the braided wire is not formed into an annular shape. When the section is formed into the annular shape, an air layer exists in a center portion of the end surface shape, namely, between the surface and backside of the braided wire, and heat transfer between the surface and the backside is obstructed by the air layer. Therefore, the solder or the brazing material may hardly become wettable to the braided wire, and the bonding strength may be decreased. Accordingly, from the viewpoint of enhancing the bonding strength between the braided wire and the thermoelectric conversion element, desirably the overlapping of the portion in which the conductive wire is braided does not exist (the braided wire is single-layer).

Figure 3E:
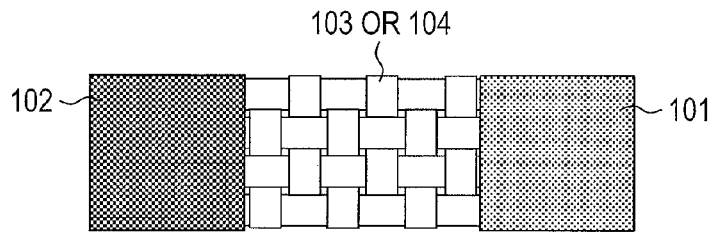

For example, plain-stitch braided wire is undesirable because of the annular sectional shape. Desirably the braided wire is the single-layer braided wire such as a mesh (FIG. 3(a)), a three-strand braided wire (FIG. 3(b)), a plain four-strand braided wire (FIG. 3(c)), and a six-strand braided wire (FIG. 3(d)). The braided wire may be a plain-stitch braided wire that is of the single-layer braided wire as illustrated in FIG. 3(e). For example, the plain four-strand braided wire is formed by braiding eight Cu wires each of which has a diameter of about 0.12 mm into plain four strands. The braided wire has a width of about 1 mm and a thickness of about 0.3 mm. The braided wire has a stretch rate of 1.2% to 10% when the braided wire is strained with a load of 1 N.

3. Method of Manufacturing Thermoelectric Conversion Module

A method of manufacturing thermoelectric conversion module 100 in FIG. 1 will be described with reference to FIG. 2.

As illustrated in FIG. 2(a), the braided wire is cut into lengths of about 2.5 mm to about 20 mm to prepare the plural braided wires (first process). For example, the braided wire is a 100-mesh braided wire that is formed by braiding Cu wires each of which has the diameter of 80 μm into plain stitch. The braided wire has the width of 2 mm. The braided wire has the stretch rate of 1.2% when the braided wire is strained with the load of 1 N. P-type elements 101 and N-type elements 102 are alternately connected in series using braided wire 103 and braided wire 104 (second process, FIG. 2(b)). Therefore, the module unit is obtained. The braided wire having the length in which P-type element 101 and N-type element 102 are connected via the gap A is used as braided wire 103. The braided wire having the length in which P-type element 101 and N-type element 102 are connected via the gap B is used as braided wire 104. The lengths of braided wire 103 are substantially equal to one another, and the lengths of braided wire 104 are substantially equal to one another. Braided wire 103 is tensioned so as not to loosen between P-type element 101 and N-type element 102. Similarly, braided wire 104 is tensioned so as not to loosen between P-type element 101 and N-type element 102.

For example, soldering, brazing, resistance welding, and ultrasonic welding are used as a method for bonding P-type element 101 or N-type element 102 and braided wire 103 or braided wire 104. The soldering and the brazing can bond the braided wire to the thermoelectric conversion element at a low temperature while a load on the thermoelectric conversion element is suppressed to a lower level. Sn (tin), Pb (lead), Bi (bismuth), In (indium), and alloys thereof can be used as the soldering and brazing materials.

When the braided wire is bonded to the thermoelectric conversion element by the resistance welding such as spot welding with no use of the bonding material such as the soldering material and the brazing material, the long-term connection reliability can be improved.

Figure 2C:
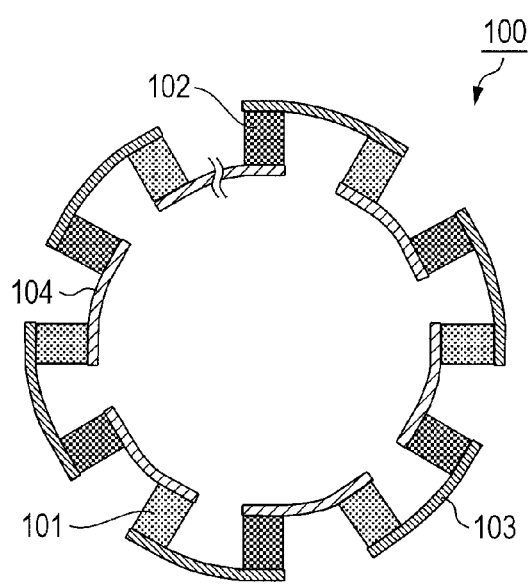

As illustrated in FIG. 2(c), the spiral thermoelectric conversion module 100 is formed by deforming braided wire 103 and braided wire 104 to the outer diameter of the tube as the heat source.

In the producing method of Embodiment 1, P-type elements 101 and N-type elements 102 are sequentially connected in series using braided wires 103 and braided wires 104, which are cut into lengths of about 2.5 mm to about 20 mm, to obtain the module unit. The module unit can be produced by another method.

Figure 4A:
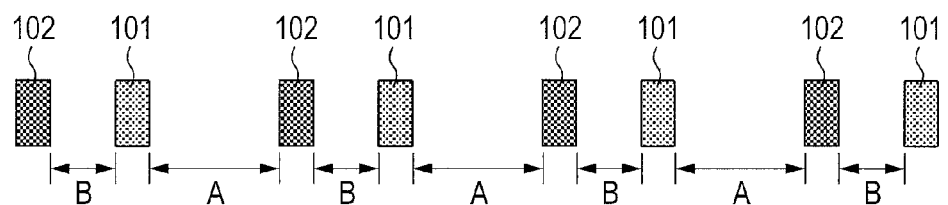
FIG. 4 is a view explaining another method for producing a module unit in the invention.

For example, the following method can be cited as another method. P-type elements 101 and N-type elements 102 are alternately arrayed. The gap between P-type element 101 and N-type element 102 is the gap A or the gap B. The gaps A and the gaps B are alternately formed (FIG. 4(a)). Then one end surface of each of all P-type elements 101 and one end surface of each of all N-type elements 102 are connected by braided wire 109, and the other end surface of each of all P-type elements 101 and the other end surface of each of all N-type elements 102 are connected by braided wire 110 (FIG.4 (b)). At a point that should be insulated, braided wire 109 and braided wire 110 are cut and removed to obtain braided wire 103 and braided wire 104 (FIG.4 (c)). In braided wire 109, the point that should be insulated is a portion in which P-type element 101 and N-type element 102 are connected via the gap B. In braided wire 110, the point that should be insulated is a portion in which P-type element 101 and N-type element 102 are connected via the gap A.

The lengths of braided wire 103 and braided wire 104 can properly be determined according to the shape of the heat source. For example, in the case that the heat source is the tube of which thermoelectric conversion module 100 is wound around the outer circumferential wall, the lengths of braided wire 103 and braided wire 104 can be determined by the diameter of the tube as the heat source and the height of the thermoelectric conversion element. More specifically, desirably a length A of braided wire 103 is equal to or more than B+(h/r)×B, more desirably B+(h/r)×B. Where "B" is a length of braided wire 104, "r" is a distance from the center of the tube as the heat source to the outer circumferential surface, and "h" is a height of P-type element 101 or N-type element 102. In the case that the heat source is the tube that has a corner portion in the outer circumferential wall thereof, the lengths of braided wire 103 and braided wire 104 may be changed according to a curvature radius of the corner portion. A tube in which an outer edge in section has a polygonal shape can be cited as an example of the tube that has the corner portion. In this case, the corner portion is a corner of the polygonal shape in section.

When braided wire 104 is not in contact with other braided wires 103 and 104, P-type element 101, or N-type element 102 while the other end surface of P-type element 101 and the other end surface of N-type element 102 are connected, braided wire 104 may run over along the direction X from the other end surface of P-type element 101 or the other end surface of N-type element 102.

The insulating layer may be formed on the surface on the outer circumference side (the upper-side surface of braided wire 103 in FIG. 2(b)) of braided wire 103 or the surface on the inner circumference side (the lower-side surface of braided wire 104 in FIG. 2(b)) according to the usage environment or intended use of the thermoelectric conversion module 100. Thermoelectric conversion module 100 may be covered with the insulating material.

4. Verification of Advantageous Effect

Actually the inventors prepared 3072 thermoelectric conversion elements, and electrically connected the thermoelectric conversion elements in series by braided wire A and braided wire B to prepare the thermoelectric conversion module of Embodiment 1. The thermoelectric conversion module was spirally wound around the tube. The outside the thermoelectric conversion module was cooled through ice water having a temperature of 4° C. while hot water having a temperature of 60° C. was caused to flow in the tube, it was verified that an electric power of 3.4 W was generated. The thermoelectric conversion module of Embodiment 1 is disposed on the tube as the heat source, thereby acting as the electric generator.

Embodiment 2

Embodiment 2 of the invention will be described below with reference to the drawings.

Figure 5:
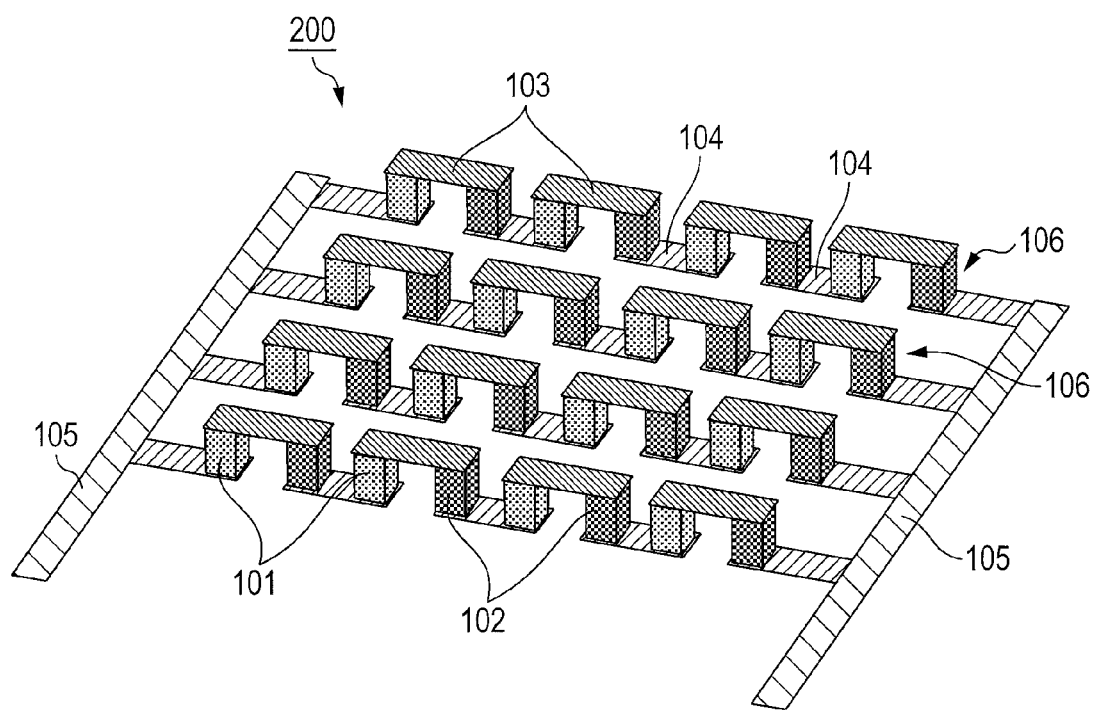
FIG. 5 is a view illustrating a schematic configuration of a thermoelectric conversion module according to Embodiment 2 of the invention.

FIG. 5 is a perspective view illustrating a schematic configuration of thermoelectric conversion module 200 according to Embodiment 2 of the invention. Thermoelectric conversion module 200 basically includes P-type element 101, N-type element 102, braided wire 103, braided wire 104, and electric wire 105.

P-type elements 101 and N-type elements 102 are alternately and electrically connected in series by braided wire 103 and braided wire 104. Braided wire 103 is bonded to the upper surfaces of P-type element 101 and N-type element 102. Braided wire 104 is bonded to the surface (lower surface) opposite to the upper surface of P-type element 101 and the surface (lower surface) opposite to the upper surface of N-type element 102. Therefore, module unit 106, in which P-type elements 101 and N-type elements 102 are alternately connected in series, is formed.

Each of braided wire 103 and braided wire 104 is the same as the braided wire. Braided wire 103 is longer than braided wire 104. Braided wire 103 and the thermoelectric conversion element, and braided wire 104 and the thermoelectric conversion element, are bonded by the bonding material such as the soldering material and the brazing material.

One end of module unit 106 and one end of another module unit 106 are connected by electric wires 105, and also the other end of module unit 106 and the other end of another module unit 106 are connected by electric wires 105. Therefore, plural module units 106 are electrically connected in series to form thermoelectric conversion module 200. Plural P-type elements 101 and plural N-type elements 102 are electrically connected in series in module unit 106, whereby thermoelectric conversion module 200 can obtain a high output voltage.

Plural module units 106 are electrically connected in parallel. Therefore, thermoelectric conversion module 200 can continuously generate the electric power even if part of module unit 106 or part of the connection portion between module unit 106 and electric wire 105 is fractured while thermoelectric conversion module 200 is used as the electric generator. Plural module units 106 are connected in parallel, whereby a distortion of thermoelectric conversion module 200 can be prevented even if the thermoelectric conversion module 200 is flexible.

In module unit 106, the number of series-connected P-type elements 101, the number of series-connected N-type element 102, and the number of module units 106 can be selected according to the usage environment or intended use of the thermoelectric conversion module 200.

Braided wire 103 differs from braided wire 104 in length. Therefore, it is clear that thermoelectric conversion module 200 is securely disposed on the outer circumferential surface of the tube such that braided wire 104 is in contact with the outer circumferential surface of the tube as the heat source, when thermoelectric conversion module 200 is disposed around the tube. Winding thermoelectric conversion module 200 around the tube can prevent the decrease in output power due to the short-circuit between braided wires 104 disposed on the inner circumference side of the thermoelectric conversion module 200.

In braided wires 103 and braided wires 104, the lengths of braided wire 103 and braided wire 104 that are disposed at both ends of module unit 106 can arbitrarily be changed according to the usage environment or intended use of thermoelectric conversion module 200.

Braided wire 103 or braided wire 104 and thermoelectric conversion element are bonded by the bonding material. Therefore, the contact area between the bonding material and braided wire 103 or braided wire 104 is large, and the bonding strength of braided wire 103 or braided wire 104 and the thermoelectric conversion element is large. Accordingly, in deforming thermoelectric conversion module 200 to the shape of the heat source, the fracture of the bonded portion can be prevented even if the stress is applied to the bonded portion of P-type element 101 and braided wire 103 or braided wire 104 and the bonded portion of N-type element 102 and braided wire 103 or braided wire 104. Therefore, thermoelectric conversion module 200 can be applied to the heat source in which stronger winding of thermoelectric conversion module 200 is required. Therefore, the shape of the heat source in which thermoelectric conversion module 200 is provided can more freely be selected. Examples of the heat source in which stronger winding of thermoelectric conversion module 200 is required includes a tube having a small diameter, a heat source having a corner portion on a surface, and a heat source having irregularity on a surface. Disposition specifications (such as a position and a direction) of the thermoelectric conversion module 200 with respect to the tube as the heat source can more freely be selected.

Figure 6A:
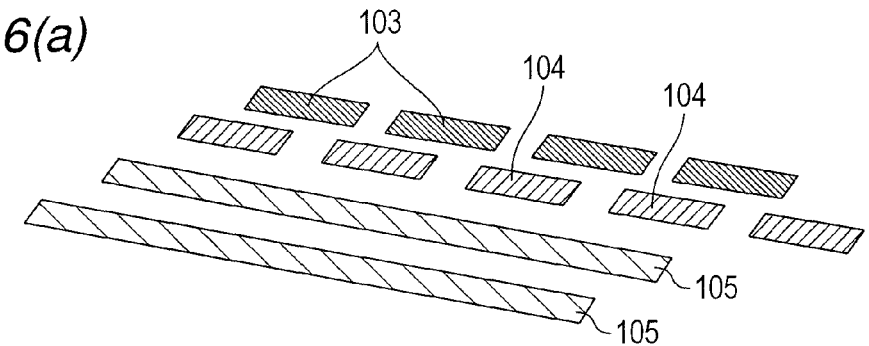
FIG. 6 is a view illustrating a method for producing the thermoelectric conversion module of Embodiment 2 of the invention.
Figure 6B:
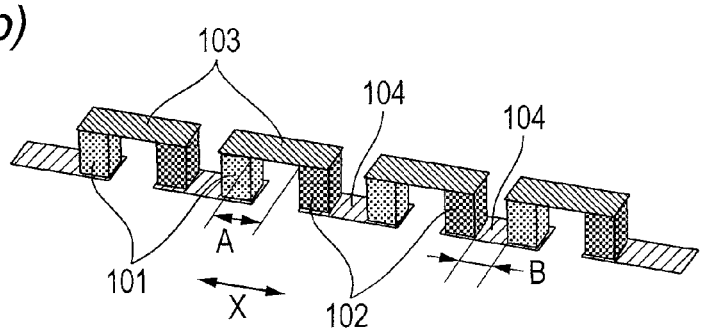
Figure 6C:
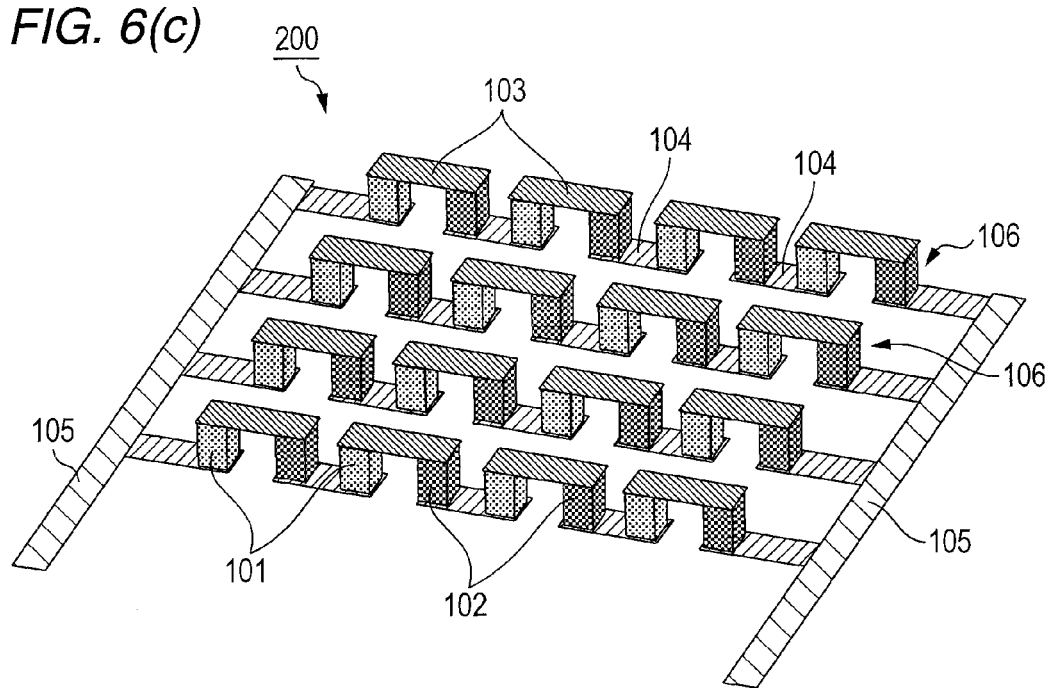
Figure 7:
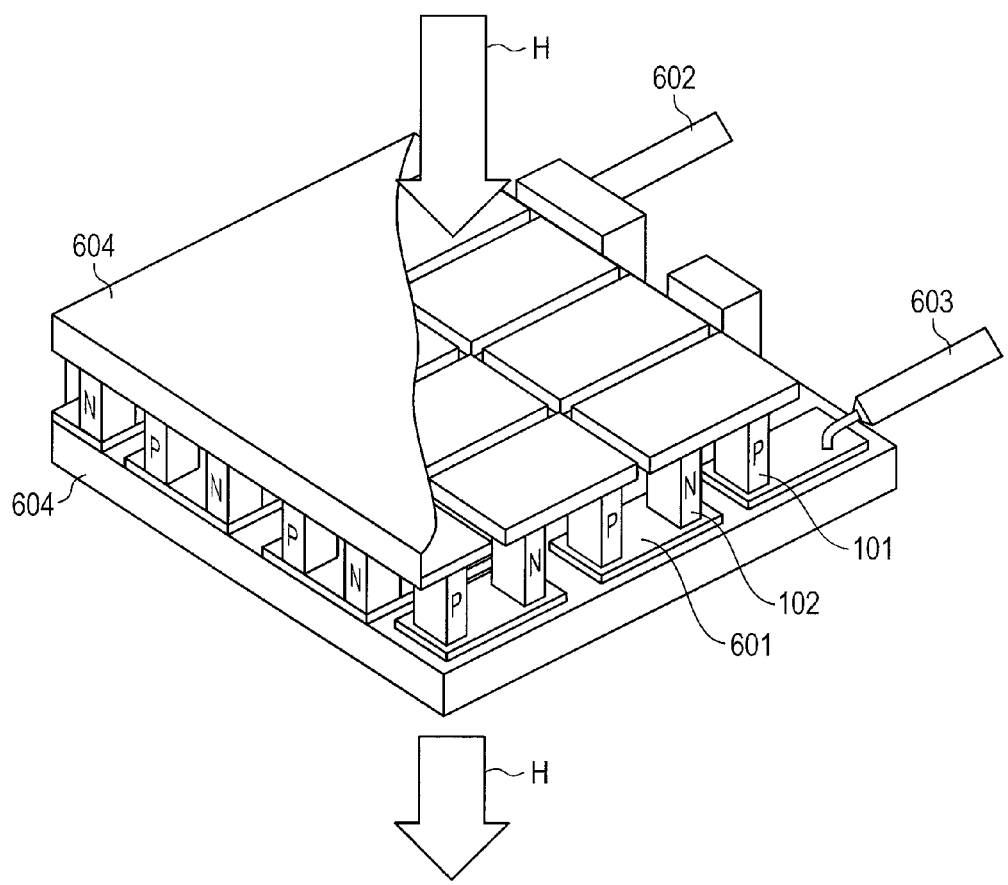
FIG. 7 is a perspective view of a conventional thermoelectric conversion module described in PTL 1.
Figure 8:
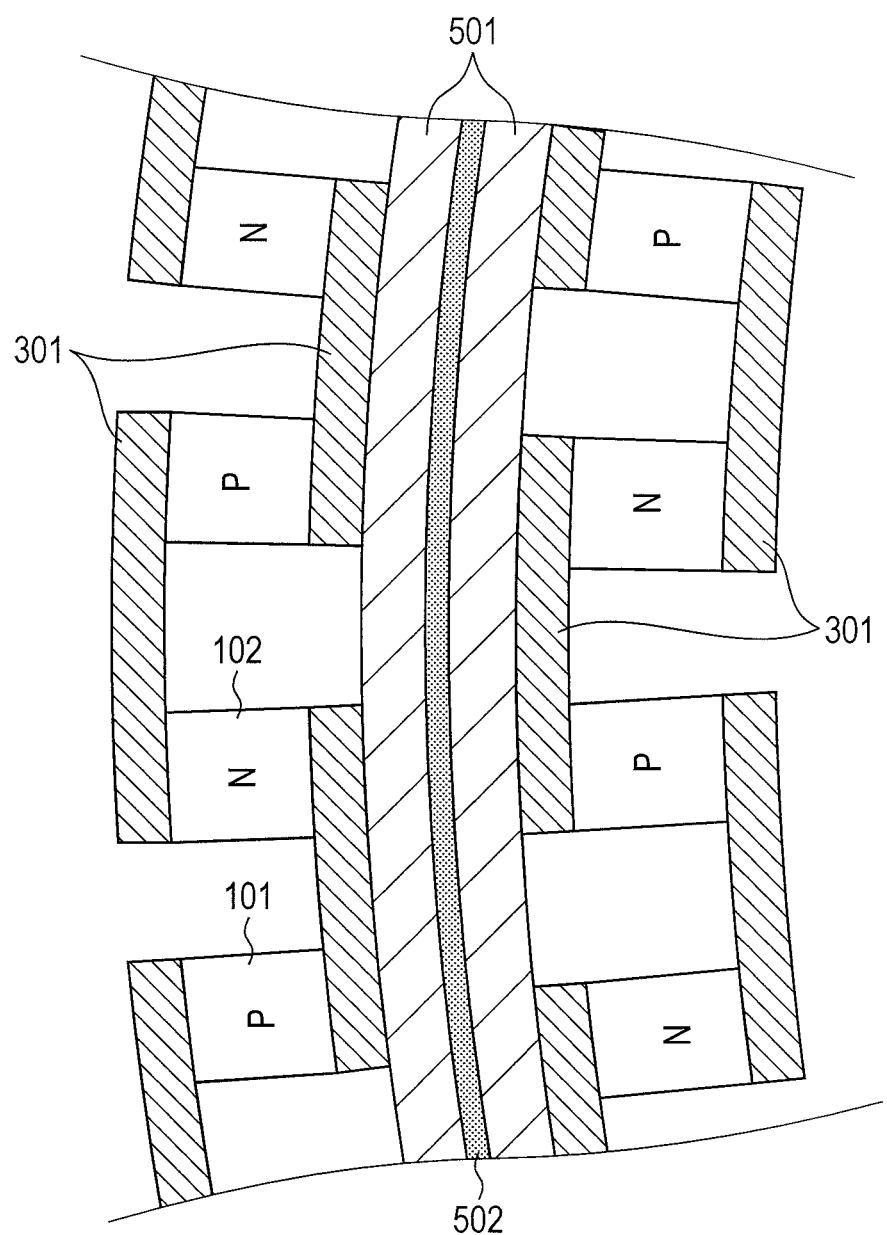
FIG. 8 is a sectional view of a conventional thermoelectric conversion module described in PTL 2.
Figure 9:
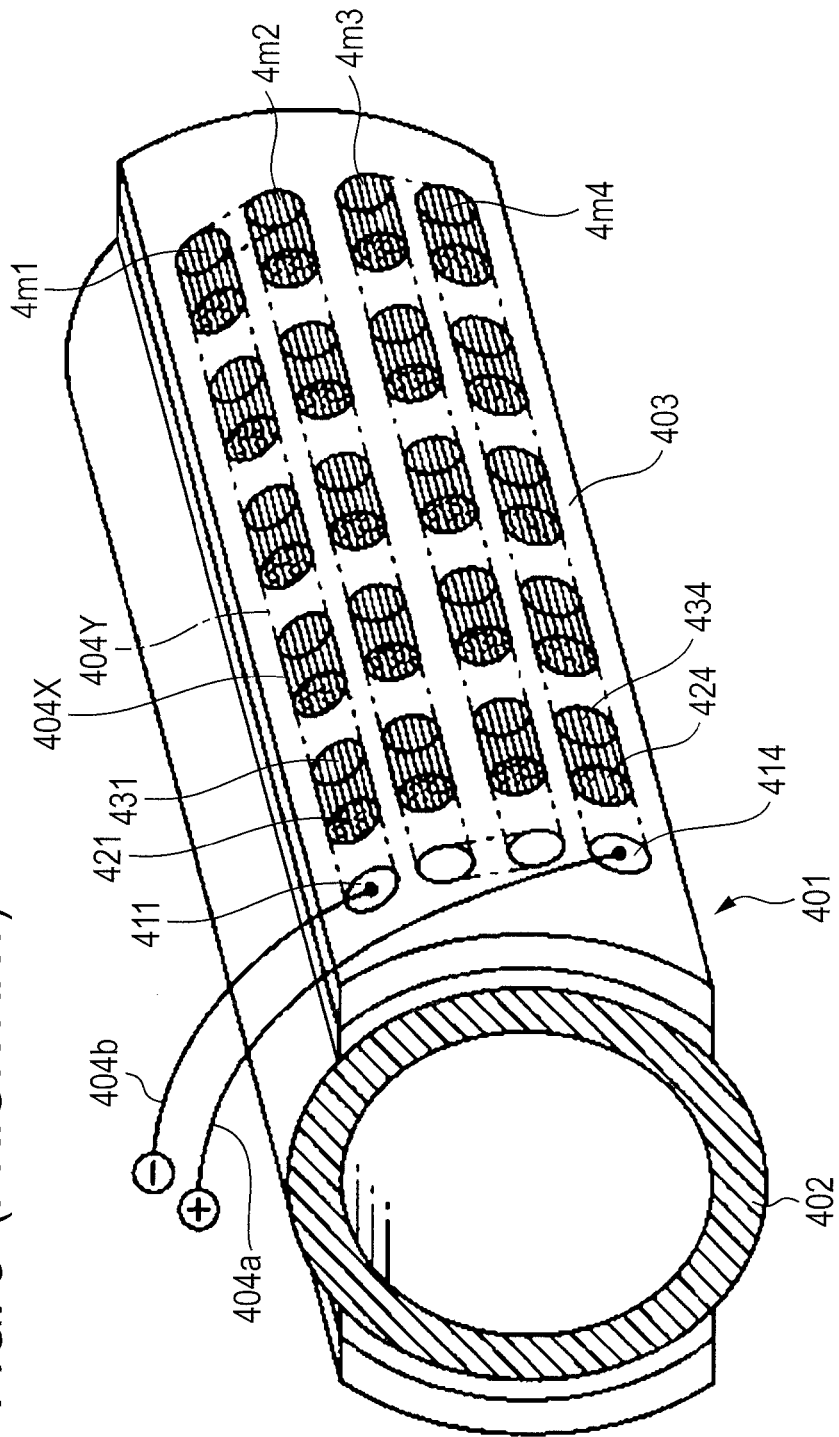
FIG. 9 is a view illustrating a schematic configuration of a conventional thermoelectric conversion module described in PTL 3.

A method for producing thermoelectric conversion module 200 in FIG. 5 will be described with reference to FIG. 6. First the conductive braided wire is cut into lengths of about 2.5 mm to about 20 mm to prepare braided wire 103 and braided wire 104 shorter than braided wire 103. The conductive material is cut to prepare electric wire 105 (FIG. 6(a)). Electric wire 105 may be the braided wire or be not the braided wire (be a metallic plate or a metallic tape). Desirably electric wire 105 has flexibility.

Then P-type elements 101 and N-type elements 102 are alternately connected in series using braided wire 103 and braided wire 104. Each of braided wire 103 and braided wire 104 is tensioned so as not to loosen between P-type element 101 and N-type element 102. Therefore, module unit 106, which has the gap A between P-type element 101 and one of N-type elements 102 adjacent to P-type element 101 along the direction X and the gap B smaller than the gap A between P-type element 101 and the other N-type element 102 adjacent to P-type element 101, is formed (FIG. 6(b)). Then, one end of each of plural module units 106 is connected to electric wire 105, and the other end of each of plural module units 106 is bonded to another electric wire 105. Therefore, plural module units 106 are electrically and geometrically connected in parallel to obtain thermoelectric conversion module 200 (FIG. 6(c)).

The braided wires in the end portions of plural module units 106 and electric wire 105 can be connected by the method such as the soldering, the brazing, the resistance welding, and the ultrasonic welding.

Figure 4B:
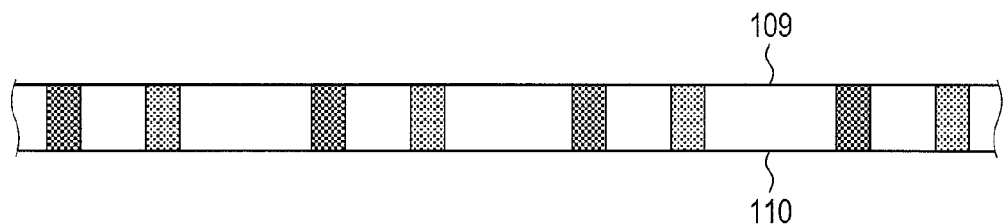
Figure 4C:
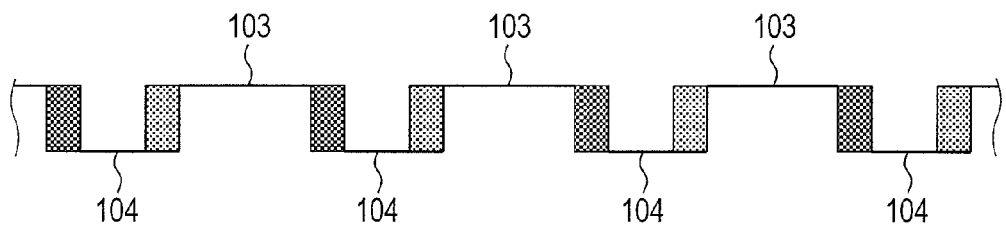

In Embodiment 2, braided wire 103 and braided wire 104 provided by cutting the conductive braided wire into lengths of about 2.5 mm to about 20 mm are used. Alternatively, as illustrated in FIG. 4, all P-type elements 101 and all N-type elements 102, which are alternately arrayed, are sandwiched between the braided wires having the lengths of 20 mm or more, P-type elements 101 and N-type elements 102 are bonded to the braided wires, and the braided wires are cut at the point that should be insulated, which allows module unit 106 to be obtained.

Braided wire 103, braided wire 104, and electric wire 105 are deformed to the shape of the heat source in attaching thermoelectric conversion module 200 to the heat source. Therefore, the contact area between the heat source and thermoelectric conversion module 200 can be increased to obtain the high output power.

As described in Embodiments 1 and 2, the thermoelectric conversion module of the invention can meet various diameters and lengths of the tube as the heat source, and prevent the short-circuit between braided wires B or the short-circuit between the thermoelectric conversion elements.

The conductive braided wire is used as the braided wire to connect the P-type element and the N-type element, which are adjacent to each other. Therefore, the bonding strength is enhanced between the braided wire and the P-type element or N-type element. Therefore, in winding spirally the thermoelectric conversion module around the tube as the heat source, even if the stress is applied to the bonded portion of the braided wire and each thermoelectric conversion element, the fracture of the bonded portion can be prevented. Accordingly, the high-reliability thermoelectric conversion module is obtained.

In the thermoelectric conversion module in which the plural module units are connected in parallel, the power generation can be performed even if a part of module units fracture. Because of the flexibility, the thermoelectric conversion module can be attached to tubes having various diameters. Therefore, the thermoelectric conversion module can detachably be attached to the desired tube as the heat source.

Industrial Applicability

In the thermoelectric conversion module of the invention and the producing method thereof, the straight-chain thermoelectric conversion module, which has the high power generation capacity and meets various diameters and lengths of the tube as the heat source, can be obtained. The thermoelectric conversion module of the invention and the producing method thereof can provide the ladder-shape thermoelectric conversion module that is easily detachably attached to the desired tube as the heat source.

Reference Signs List 100, 200 Thermoelectric conversion module
101 P-type thermoelectric conversion element
102 N-type thermoelectric conversion element
103, 104, 109, 110 Braided wire
105 Electric wire
106 Module unit
301, 601 Connection electrode
401 Tubular thermoelectric conversion module
402 Metallic tube
403 Insulating board
404a, 404b Lead
404X Surface connection electrode
404Y Backside connection electrode
411, 414, 421, 424, 431, 434, 4m1 to 4m4 Thermoelectric conversion element
501 Polymer material layer
502 Adhesive resin
602, 603 External connection terminal
604 Board
H Arrow indicating heat flowing direction

The invention claimed is:

1. A thermoelectric conversion module comprising a module unit, the module unit including:
   a plurality of P-type thermoelectric conversion elements and a plurality of N-type thermoelectric conversion elements, each of the P-type thermoelectric conversion elements and each of the N-type thermoelectric conversion elements being alternately arrayed and electrically connected in series;
   a braided wire A constructed by braiding a conductive sheet wire, the braided wire A connecting one end surface of one of the P-type thermoelectric conversion elements and one end surface of one of the N-type thermoelectric conversion elements; and
   a braided wire B constructed by braiding a conductive sheet wire, the braided wire B connecting the other end surface of one of the P-type thermoelectric conversion elements and the other end surface of one of the N-type thermoelectric conversion elements, the braided wire B being shorter than the braided wire A, wherein
   each of the braided wire A and the braided wire B is a single-layer braided sheet wire, and
   each of the braided wire A and the braided wire B is a three-strand braided wire, a four-strand braided wire, a six-strand braided wire, or a plain-stitch braided wire.

2. The thermoelectric conversion module according to claim 1, wherein a diameter of the conductive sheet wire ranges from 100 μm to 400 μm.

3. The thermoelectric conversion module according to claim 1, further comprising an insulating layer covering a surface of the braided wire A.

4. The thermoelectric conversion module according to claim 1, further comprising two or more module units including the module unit, wherein the plurality of module units are electrically connected in parallel.

5. An electric generator comprising the thermoelectric conversion module according to claim 1 that is wound around a tube.

6. A method of manufacturing a thermoelectric conversion module according to claim 1 comprising:
- a first step of preparing the braided wire A constructed by braiding a conductive sheet wire and the braided wire B constructed by braiding a conductive sheet wire, the braided wire B being shorter than the braided wire A; and
- a second step of alternately connecting each of the plurality of P-type thermoelectric conversion elements and each of the plurality of N-type thermoelectric conversion elements by the braided wire A and the braided wire B to obtain the module unit in which each of the P-type thermoelectric conversion elements and each of the N-type thermoelectric conversion elements are electrically connected in series,
- wherein, in the second step, the one end surface of one of the P-type thermoelectric conversion elements and the one end surface of one of the N-type thermoelectric conversion elements are connected by the braided wire A while the other end surface of one of the P-type thermoelectric conversion elements and the other end surface of one of the N-type thermoelectric conversion elements are connected by the braided wire B.

7. The method according to claim 6, further comprising:
- a step of preparing two or more module units including the module unit, the step including the first step and second step; and
- a step of electrically connecting the plurality of module units to each other in parallel.

* * * * *